(12) United States Patent
Pease et al.

(10) Patent No.: US 9,324,589 B2
(45) Date of Patent: *Apr. 26, 2016

(54) MULTIPLEXED HEATER ARRAY USING AC DRIVE FOR SEMICONDUCTOR PROCESSING

(75) Inventors: John Pease, San Mateo, CA (US); Neil Benjamin, East Palo Alto, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 386 days.

This patent is subject to a terminal disclaimer.

(21) Appl. No.: 13/406,978

(22) Filed: Feb. 28, 2012

(65) Prior Publication Data

US 2013/0220989 A1   Aug. 29, 2013

(51) Int. Cl.
| | | |
|---|---|---|
| H05B 3/68 | (2006.01) | |
| H01L 21/67 | (2006.01) | |
| H01L 21/683 | (2006.01) | |

(52) U.S. Cl.
CPC ...... *H01L 21/67103* (2013.01); *H01L 21/6831* (2013.01)

(58) Field of Classification Search
CPC .... H05B 3/26; H05B 1/0233; C23C 16/4586; C23C 14/541
USPC ............. 219/458.1, 444.1, 443.1, 478, 461.1, 219/462.1, 465.1, 466.1, 467.1, 468.1, 219/468.2
See application file for complete search history.

(56) References Cited

U.S. PATENT DOCUMENTS

| | | |
|---|---|---|
| 3,440,883 A | 4/1969 | Lightner |
| 4,099,228 A | 7/1978 | Cohn |
| 5,059,770 A | 10/1991 | Mahawili |
| 5,255,520 A | 10/1993 | O'Geary et al. |
| 5,414,245 A * | 5/1995 | Hackleman ................. 219/548 |
| 5,504,471 A | 4/1996 | Lund |
| 5,515,683 A | 5/1996 | Kessler |

(Continued)

FOREIGN PATENT DOCUMENTS

| | | |
|---|---|---|
| JP | 2005123286 A | 5/2005 |
| JP | 2005294237 A | 10/2005 |
| KR | 20080058109 A | 6/2008 |

OTHER PUBLICATIONS

International Search Report and Written Opinion mailed Apr. 4, 2013 for PCT/US2013/023823.

(Continued)

*Primary Examiner* — Tu B Hoang
*Assistant Examiner* — Alba Rosario-Aponte
(74) *Attorney, Agent, or Firm* — Buchanan Ingersoll & Rooney

(57) ABSTRACT

A heating plate for a substrate support assembly in a semiconductor plasma processing apparatus, comprises multiple independently controllable planar heater zones arranged in a scalable multiplexing layout, and electronics to independently control and power the planar heater zones. A substrate support assembly in which the heating plate is incorporated includes an electrostatic clamping electrode and a temperature controlled base plate. Methods for manufacturing the heating plate include bonding together ceramic or polymer sheets having planar heater zones, branch transmission lines, common transmission lines and vias. The heating plate is capable of being driven by AC current or direct current phase alternating power, which has an advantage of minimizing DC magnetic field effects above the substrate support assembly and reduce plasma non-uniformity caused by DC magnetic fields.

20 Claims, 7 Drawing Sheets

(56) References Cited

U.S. PATENT DOCUMENTS

| | | |
|---|---|---|
| 5,536,918 A | 7/1996 | Ohkase et al. |
| 5,635,093 A | 6/1997 | Arena et al. |
| 5,665,166 A | 9/1997 | Deguchi et al. |
| 5,667,622 A | 9/1997 | Hasegawa et al. |
| 5,740,016 A | 4/1998 | Dhindsa |
| 5,802,856 A | 9/1998 | Schaper et al. |
| 5,851,298 A | 12/1998 | Ishii |
| 5,886,866 A | 3/1999 | Hausmann |
| 5,994,675 A | 11/1999 | Bethune et al. |
| 6,060,697 A | 5/2000 | Morita et al. |
| 6,091,060 A | 7/2000 | Getchel et al. |
| 6,095,084 A | 8/2000 | Shamouilian et al. |
| 6,100,506 A | 8/2000 | Colelli, Jr. et al. |
| 6,175,175 B1 | 1/2001 | Hull |
| 6,222,161 B1 | 4/2001 | Shirakawa et al. |
| 6,271,459 B1 | 8/2001 | Yoo |
| 6,353,209 B1 | 3/2002 | Schaper et al. |
| 6,403,403 B1 * | 6/2002 | Mayer et al. ............... 438/132 |
| 6,475,336 B1 | 11/2002 | Hubacek |
| 6,483,690 B1 | 11/2002 | Nakajima et al. |
| 6,512,207 B1 | 1/2003 | Dress et al. |
| 6,523,493 B1 | 2/2003 | Brcka |
| 6,566,632 B1 | 5/2003 | Katata et al. |
| 6,612,673 B1 | 9/2003 | Giere et al. |
| 6,664,515 B2 | 12/2003 | Natsuhara et al. |
| 6,739,138 B2 | 5/2004 | Saunders et al. |
| 6,740,853 B1 | 5/2004 | Johnson et al. |
| 6,741,446 B2 | 5/2004 | Ennis |
| 6,746,616 B1 | 6/2004 | Fulford et al. |
| 6,795,292 B2 | 9/2004 | Grimard et al. |
| 6,815,365 B2 | 11/2004 | Masuda et al. |
| 6,825,617 B2 | 11/2004 | Kanno et al. |
| 6,835,290 B2 | 12/2004 | Reiter et al. |
| 6,847,014 B1 | 1/2005 | Benjamin et al. |
| 6,870,728 B1 | 3/2005 | Burket et al. |
| 6,886,347 B2 | 5/2005 | Hudson et al. |
| 6,921,724 B2 | 7/2005 | Kamp et al. |
| 6,979,805 B2 | 12/2005 | Arthur et al. |
| 6,985,000 B2 | 1/2006 | Feder et al. |
| 6,989,210 B2 | 1/2006 | Gore |
| 7,075,031 B2 | 7/2006 | Strang et al. |
| 7,141,763 B2 | 11/2006 | Moroz |
| 7,173,222 B2 | 2/2007 | Cox et al. |
| 7,175,714 B2 | 2/2007 | Ootsuka et al. |
| 7,206,184 B2 | 4/2007 | Ennis |
| 7,230,204 B2 | 6/2007 | Mitrovic et al. |
| 7,250,309 B2 | 7/2007 | Mak et al. |
| 7,268,322 B2 | 9/2007 | Kuibira et al. |
| 7,274,004 B2 | 9/2007 | Benjamin et al. |
| 7,275,309 B2 | 10/2007 | Matsuda et al. |
| 7,279,661 B2 | 10/2007 | Okajima et al. |
| 7,297,894 B1 | 11/2007 | Tsukamoto |
| 7,311,782 B2 | 12/2007 | Strang et al. |
| 7,372,001 B2 | 5/2008 | Tachikawa et al. |
| 7,396,431 B2 | 7/2008 | Chen et al. |
| 7,415,312 B2 | 8/2008 | Barnett, Jr. et al. |
| 7,475,551 B2 | 1/2009 | Ghoshal |
| 7,480,129 B2 | 1/2009 | Brown et al. |
| 7,504,006 B2 | 3/2009 | Gopalraja et al. |
| 7,718,932 B2 * | 5/2010 | Steger ............... 219/494 |
| 7,782,583 B2 | 8/2010 | Moon |
| 7,893,387 B2 | 2/2011 | Ohata |
| 7,940,064 B2 | 5/2011 | Segawa et al. |
| 7,952,049 B2 | 5/2011 | Tsukamoto |
| 7,968,825 B2 | 6/2011 | Jyousaka et al. |
| 8,057,602 B2 | 11/2011 | Koelmel et al. |
| 8,136,820 B2 | 3/2012 | Morioka et al. |
| 8,222,574 B2 | 7/2012 | Sorabji et al. |
| 8,295,026 B2 * | 10/2012 | Matsuyama ............... 361/234 |
| 8,461,674 B2 * | 6/2013 | Gaff et al. ............... 257/690 |
| 8,546,732 B2 * | 10/2013 | Singh ............... 219/486 |
| 8,624,168 B2 * | 1/2014 | Gaff et al. ............... 219/444.1 |
| 2002/0043528 A1 | 4/2002 | Ito |
| 2003/0150712 A1 * | 8/2003 | Reiter et al. ............... 204/192.12 |
| 2005/0016465 A1 | 1/2005 | Ramaswamy et al. |
| 2005/0215073 A1 | 9/2005 | Nakamura et al. |
| 2005/0229854 A1 | 10/2005 | Moroz |
| 2006/0191637 A1 | 8/2006 | Zajac et al. |
| 2006/0226123 A1 | 10/2006 | Birang |
| 2007/0125762 A1 | 6/2007 | Cui et al. |
| 2008/0029195 A1 | 2/2008 | Lu |
| 2008/0202924 A1 | 8/2008 | Bluck et al. |
| 2009/0000738 A1 | 1/2009 | Benjamin |
| 2009/0173445 A1 | 7/2009 | Yeom et al. |
| 2009/0183677 A1 | 7/2009 | Tian et al. |
| 2009/0215201 A1 | 8/2009 | Benjamin et al. |
| 2010/0078424 A1 | 4/2010 | Tsukamoto et al. |
| 2010/0116788 A1 | 5/2010 | Singh et al. |
| 2010/0257871 A1 | 10/2010 | Venkatasubramanian et al. |
| 2010/0283565 A1 | 11/2010 | Blakes |
| 2011/0005682 A1 | 1/2011 | Savas et al. |
| 2011/0033175 A1 | 2/2011 | Kasai et al. |
| 2011/0092072 A1 * | 4/2011 | Singh et al. ............... 438/710 |
| 2011/0108706 A1 | 5/2011 | Koyama |
| 2011/0143462 A1 | 6/2011 | Gaff et al. |
| 2012/0097661 A1 * | 4/2012 | Singh ............... 219/446.1 |
| 2013/0003250 A1 * | 1/2013 | Morimoto et al. ............... 361/234 |
| 2013/0072035 A1 * | 3/2013 | Gaff et al. ............... 438/798 |

OTHER PUBLICATIONS

Ayars, Eric, "Bandgap in a Semiconductor Diode", Advanced and Intermediate Instructional Labs Workshop, AAPT Summer Meeting, California State university, Chicago, Jul. 20, 2008 http://phys.csuchico.edu/-eayars/publications/bandgap.pdf.

Commonly-Owned Utility U.S. Appl. No. 12/910,347, filed Oct. 22, 2010.

Commonly-Owned Utility U.S. Appl. No. 12/943,492, filed Nov. 10, 2010.

Commonly-Owned Utility U.S. Appl. No. 13/237,444, filed Sep. 20, 2011.

Commonly-Owned Utility U.S. Appl. No. 13/234,473, filed Sep. 16, 2011.

Commonly-Owned Utility U.S. Appl. No. 13/238,396, filed Sep. 21, 2011.

International Preliminary Report on Patentability mailed Sep. 12, 2014 for PCT/US2013/023823.

* cited by examiner

MULTIPLEXED HEATER ARRAY USING AC DRIVE FOR SEMICONDUCTOR PROCESSING

BACKGROUND OF THE DISCLOSURE

With each successive semiconductor technology generation, substrate diameters tend to increase and transistor sizes decrease, resulting in the need for an ever higher degree of accuracy and repeatability in substrate processing. Semiconductor substrate materials, such as silicon substrates, are processed by techniques which include the use of vacuum chambers. These techniques include non-plasma applications such as electron beam deposition, as well as plasma applications, such as sputter deposition, plasma-enhanced chemical vapor deposition (PECVD), resist strip, and plasma etch.

Plasma processing systems available today are among those semiconductor fabrication tools which are subject to an increasing need for improved accuracy and repeatability. One metric for plasma processing systems is increased uniformity, which includes uniformity of process results on each semiconductor substrate surface as well as uniformity of process results of a succession of substrates processed with nominally the same input parameters. Continuous improvement of on-substrate uniformity is desirable. Among other things, this calls for plasma chambers with improved uniformity, consistency and self diagnostics.

SUMMARY OF THE INVENTION

Described herein is a heating plate for a substrate support assembly used to support a semiconductor substrate in a semiconductor processing apparatus, the heating plate comprising: a first electrically insulating layer; planar heater zones comprising at least first, second, third and fourth planar heater zones, the planar heater zones laterally distributed across the first electrically insulating layer and operable to tune a spatial temperature profile on the substrate; first power lines comprising at least a first electrically conductive power line electrically connected to the first and second planar heater zones and a second electrically conductive power line electrically connected to the third and fourth planar heater zones; and second power lines comprising at least a third electrically conductive power line electrically connected to the first and third planar heater zones and a fourth electrically conductive power return line electrically connected to the second and fourth planar heater zones wherein at least one of a power supply, a power line or a diode is configured to reduce an electromagnetic field above the heating plate.

DETAILED DESCRIPTION

Figure 1:
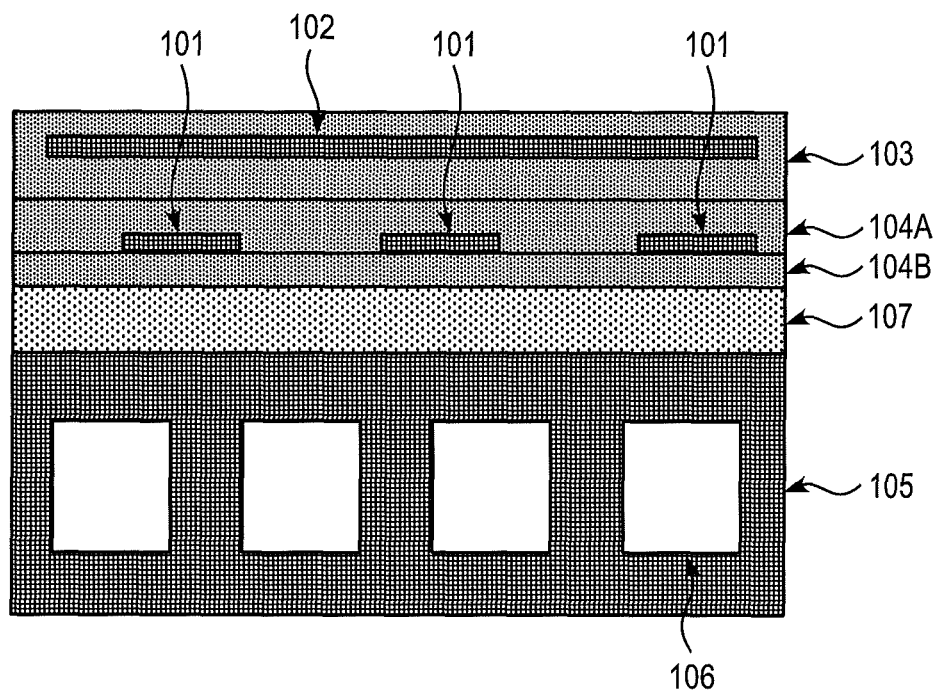
FIG. 1 is a schematic of the cross-sectional view of a substrate support assembly in which a heating plate with an array of planar heater zones is incorporated, the substrate support assembly also comprising an electrostatic chuck (ESC).

Radial and azimuthal substrate temperature control in a semiconductor processing apparatus to achieve desired critical dimension (CD) uniformity on the substrate is becoming more demanding. Even a small variation of temperature may affect CD to an unacceptable degree, especially as CD approaches sub-100 nm in semiconductor fabrication processes.

A substrate support assembly may be configured for a variety of functions during processing, such as supporting the substrate, tuning the substrate temperature, and supplying radio frequency power. The substrate support assembly can comprise an electrostatic chuck (ESC) useful for electrostatically clamping a substrate onto the substrate support assembly during processing. The ESC may be a tunable ESC (T-ESC). A T-ESC is described in commonly assigned U.S. Pat. Nos. 6,847,014 and 6,921,724, which are hereby incorporated by reference. The substrate support assembly may comprise a ceramic substrate plate such as an ESC, a fluid-cooled heat sink (hereafter referred to as a cooling plate) and a plurality of planar heater zones to realize step by step and spatial temperature control. Typically, the cooling plate is maintained at a constant temperature which may be between 0° C. and 30° C. or outside this range. The heaters are separated from the cooling plate by a layer of thermal insulator therebetween. The heaters can maintain the support surface of the substrate support assembly at temperatures about 0° C. to 80° C. above the cooling plate temperature whether or not the substrate is heated by thermal flux during plasma processing. By changing the heater power within the plurality of planar heater zones, the substrate support temperature profile can be changed. Further, the mean substrate support temperature can be changed step by step within the operating range of 0 to 80° C. or higher above the cooling plate temperature. A small azimuthal temperature variation poses increasingly greater challenges as CD decreases with the advance of semiconductor technology.

Controlling temperature is not an easy task for several reasons. First, many factors can affect heat transfer, such as the locations of heat sources and heat sinks, the movement, materials and shapes of the heat transfer media. Second, heat transfer is a dynamic process. Unless the system in question is in thermal equilibrium, heat transfer will occur and the temperature profile and heat transfer will change with time. Third, non-equilibrium phenomena, such as plasma, which of course is present during plasma processing, make accurate theoretical prediction of the heat transfer behavior of any practical plasma processing apparatus very difficult if not impossible.

The substrate temperature profile in a plasma processing apparatus is affected by many factors, such as the plasma density profile, the RF power profile and the detailed structure of the various heating and cooling elements in the chuck, hence the substrate temperature profile is often not uniform and difficult to control with a small number of heating or cooling elements. This deficiency translates to non-uniformity in the processing rate across the whole substrate and non-uniformity in the critical dimension of the device dies on the substrate. It may be desired to introduce a deliberate non-uniform temperature profile to compensate for other effects including but not limited to the non-uniformity of incoming substrates, the uniformity of the process to be carried out, and uniformity expected in subsequent steps.

In light of the complex nature of temperature control, it would be advantageous to incorporate multiple independently controllable planar heater zones in the substrate support assembly to enable the apparatus to actively create and maintain the desired spatial and temporal temperature profile, and to compensate for other adverse factors that affect CD uniformity.

A heating plate for a substrate support assembly in a semiconductor processing apparatus with multiple independently controllable planar heater zones is disclosed in commonly-owned U.S. Patent Publication No. 2011/0092072, the disclosure of which is hereby incorporated by reference. This heating plate comprises a scalable multiplexing layout scheme of the planar heater zones and conductor lines for providing power to the planar heater zones. By tuning the power of the planar heater zones, the temperature profile during processing can be shaped both radially and azimuthally.

Described herein is a heating plate with multiple independently controllable planar heater zones wherein the planar heater zones across the heating plate can be individually powered by AC current. As used herein "AC current" refers to current provided by an AC power source or current provided by a DC power source through a suitable switching arrangement.

The planar heater zones in this heating plate are preferably arranged in a defined pattern, for example, a rectangular grid, a hexagonal grid, a polar array, concentric rings or any desired pattern. Each planar heater zone may be of any suitable size and may have one or more heater elements. All heater elements in a planar heater zone are turned on or off together. To minimize the number of electrical connections while enabling powering the planar heater zones with AC current, power lines such as forward branch transmission lines, reverse branch transmission lines and common transmission lines are arranged such that each forward branch transmission line is connected to a different group of planar heater zones, and has a corresponding reverse branch transmission line connected to the same group of planar heater zones as the forward branch transmission line is connected to, and each common transmission line is connected to a different group of planar heater zones wherein each planar heater zone being in one of the groups connected to a particular forward branch transmission line and one of the groups connected to a particular common transmission line. No two planar heater zones are connected to the same pair of forward branch transmission and common transmission lines. Thus, a planar heater zone can be activated by directing AC current through a forward branch transmission line or its corresponding reverse branch transmission line, and a common transmission line to which this particular planar heater zone is connected. The power of the heater elements is preferably smaller than 20 W, more preferably 5 to 10 W. The heater elements may be thin film resistive heaters, such as polyimide heaters, silicone rubber heaters, mica heaters, metal heaters (e.g. W, Ni/Cr alloy, Mo or Ta), ceramic heaters (e.g. WC), semiconductor heaters or carbon heaters. The heater elements may be screen printed, wire wound or etched foil heaters. In one embodiment, each planar heater zone is not larger than four device dies being manufactured on a semiconductor substrate, or not larger than two device dies being manufactured on a semiconductor substrate, or not larger than one device die being manufactured on a semiconductor substrate, or from 16 to 100 $cm^2$ in area, or from 1 to 15 $cm^2$ in area, or from 2 to 3 $cm^2$ in area to correspond to the device dies on the substrate. The thickness of the heater elements may range from 2 micrometers to 1 millimeter, preferably 5-80 micrometers. To allow space between planar heater zones and/or forward branch transmission lines, reverse branch transmission lines and common transmission lines, the total area of the planar heater zones may be up to 90% of the area of the upper surface of the substrate support assembly, e.g. 50-90% of the area. The forward branch transmission lines, the reverse branch transmission lines or the common transmission lines (power lines, collectively) may be arranged in gaps ranging from 1 to 10 mm between the planar heater zones, or in separate planes separated from the planar heater zones plane by electrically insulating layers. The branch transmission lines and the common transmission lines are preferably made as wide as the space allows, in order to carry large current and reduce Joule heating. In one embodiment, in which the power lines are in the same plane as the planar heater zones, the width of the power lines is preferably between 0.3 mm and 2 mm. In another embodiment, in which the power lines are on different planes than the planar heater zones, the width of the power lines can be as large as the planar heater zones, e.g. for a 300 mm chuck, the width can be 1 to 2 inches. The materials of the power lines may be the same as or different from the materials of the heater elements. Preferably, the materials of the power lines are materials with low resistivity, such as Cu, Al, W, Inconel® or Mo. Preferably the layout of the power lines minimizes disturbances to desired temperature profile and minimizes local effects on magnetic field non-uniformity.

Figure 2:
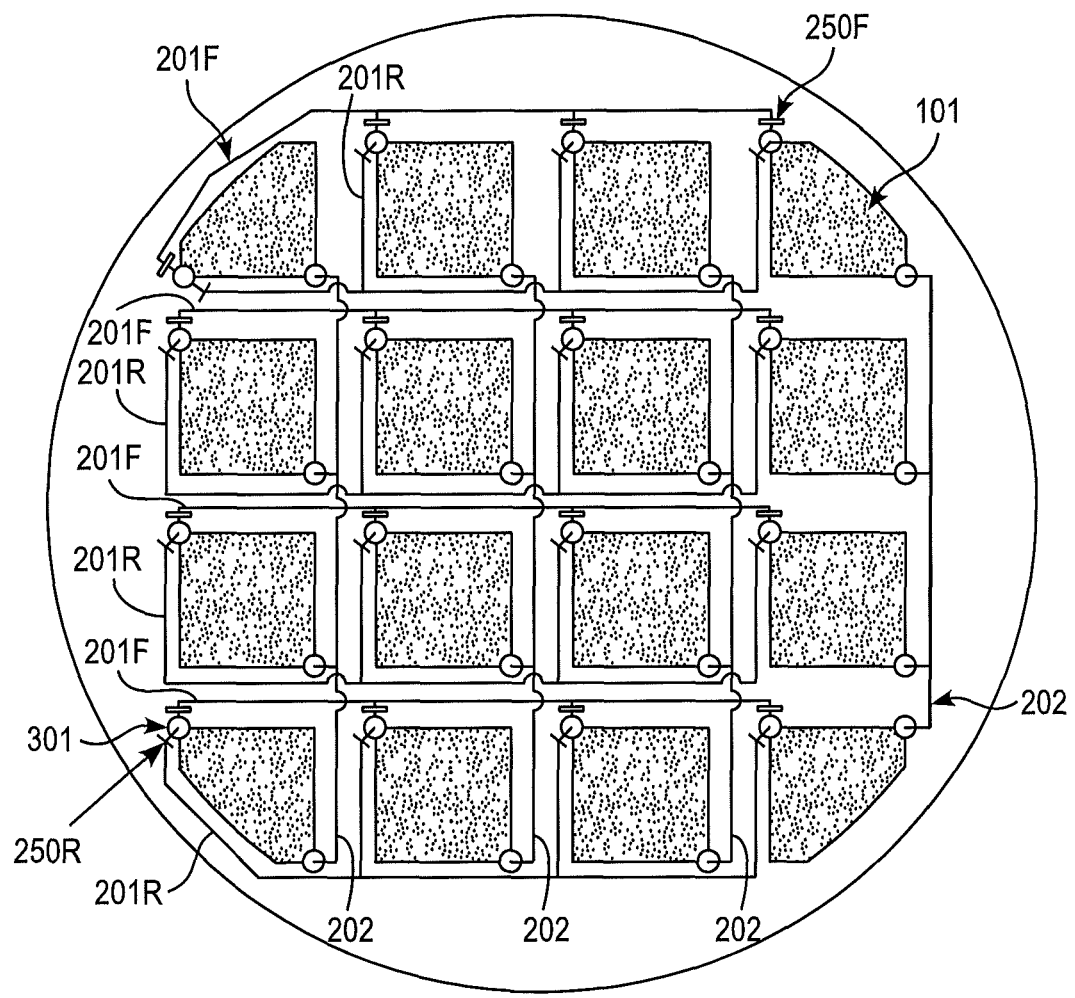
FIG. 2 illustrates the topological connection between forward branch transmission lines, reverse branch transmission lines and common transmission lines to an array of planar heater zones in one embodiment of a heating plate which can be incorporated in a substrate support assembly.

FIGS. 1-2 show a substrate support assembly comprising one embodiment of the heating plate having an array of planar heater zones 101 incorporated between two electrically insulating layers 104A and 104B. The electrically insulating layers 104A and 104B may be a polymer material, an inorganic material, a ceramic such as silicon oxide, alumina, yttria, aluminum nitride or other suitable material. The substrate support assembly further comprises (a) an ESC having a ceramic layer 103 (electrostatic clamping layer) in which an electrode 102 (e.g. monopolar or bipolar) is embedded to electrostatically clamp a substrate to the surface of the ceramic layer 103 with a DC voltage, (b) a thermal barrier layer 107, (c) a cooling plate 105 containing channels 106 for coolant flow.

As shown in FIG. 2, each of the planar heater zones 101 is connected to a forward branch transmission line 201F, a reverse branch transmission line 201R corresponding to the forward branch transmission line 201F and a common transmission line 202. No two planar heater zones 101 share the same pair of forward branch transmission line 201F and common transmission line 202 or the same pair of reverse branch transmission line 201R and common transmission line 202. By suitable electrical switching arrangements, it is possible to connect a pair of forward branch transmission 201F and common transmission 202 lines or a pair of reverse branch transmission 201R and common transmission 202 lines to a power supply (not shown), whereby only the planar heater zone connected to this pair of lines is turned on. The time-averaged heating power of each planar heater zone can be individually tuned by time-domain multiplexing. A diode 250F is serially connected between each planar heater zone 101 and the forward branch transmission line 201F connected thereto (as shown in FIG. 2) such that the diode 250F does not allow current flow from the planar heater zone 101 to the forward branch transmission line 201F. A diode 250R is serially connected between each planar heater zone 101 and the reverse branch transmission line 201R connected thereto (as shown in FIG. 2) such that the diode 250R does not allow current flow from the reverse branch transmission line 201R to the planar heater zone 101. The diodes 250F and 250R can be physically located in the heating plate or any suitable location.

Electrical components including the forward branch transmission lines 201F, the reverse branch transmission lines 201R, the common transmission lines 202, the diodes 250F and 250R, and the planar heater zones 101 can be arranged in various planes in any suitable order in the heating plate, wherein the planes are separated from each other by an electrically insulating material. Electrical connections between the planes can be made by suitably arranged vertically extending vias. Preferably, the heaters are arranged closest to the substrate support assembly upper surface.

FIG. 3-8 show embodiments of the heating plate with different arrangements of the electrical components.

Figure 3:
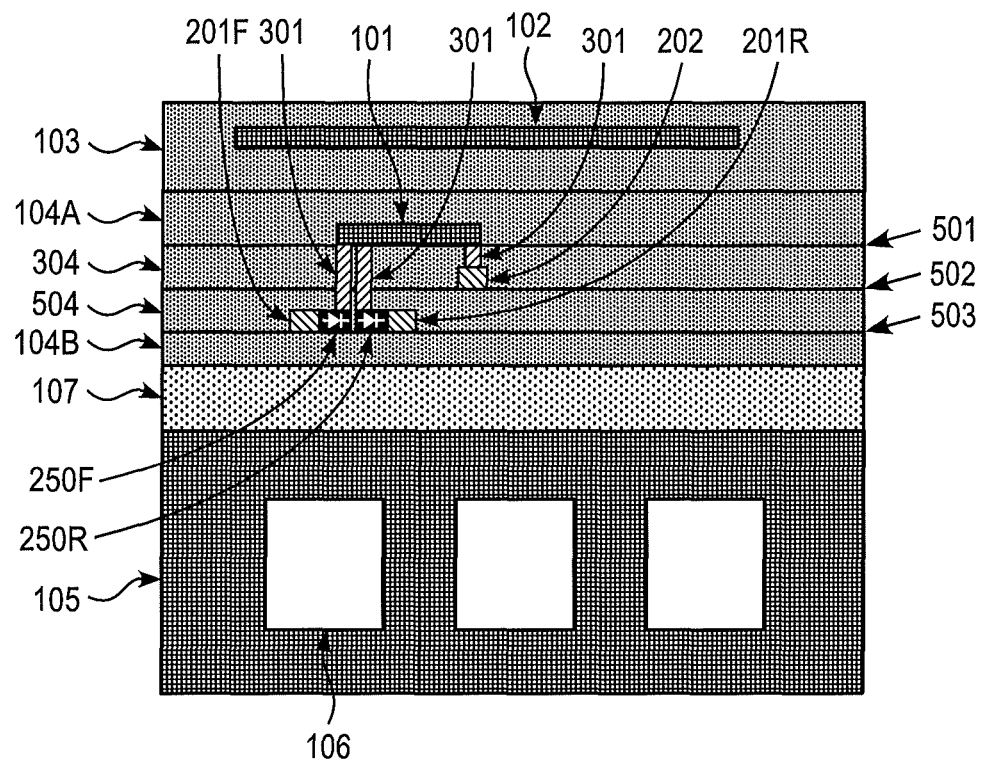
FIGS. 3-8 show exemplary heating plates with the planar heater zones, forward branch transmission lines, reverse branch transmission lines, common transmission lines and diodes variously arranged in planes in the heating plate.

FIG. 3 shows a substrate support assembly comprising the heating plate according to an embodiment wherein the planar heater zones 101 (only one shown) are arranged in a first plane 501; the common transmission lines 202 (only one shown) are arranged in a second plane 502; and the forward branch transmission lines 201F (only one shown) and reverse branch transmission lines 201R (only one shown) are arranged in a third plane 503. The first plane 501, second plane 502 and third plane 503 are separated from each other by electrically insulating layers 504 and 304. The forward branch transmission line 201F is connected to the planar heater zone 101 through a diode 250F disposed in the third plane 503 and a via 301. The reverse branch transmission line 201R is connected to the planar heater zone 101 through a diode 250R disposed in the third plane 503 and a via 301. The common transmission line 202 is connected to the planar heater zone 101 through a via 301. The diode 250F does not allow current flow from the planar heater zone 101 to the forward branch transmission line 201F. The diode 250R does not allow current flow from the reverse branch transmission line 201R to the planar heater zone 101.

Figure 4:
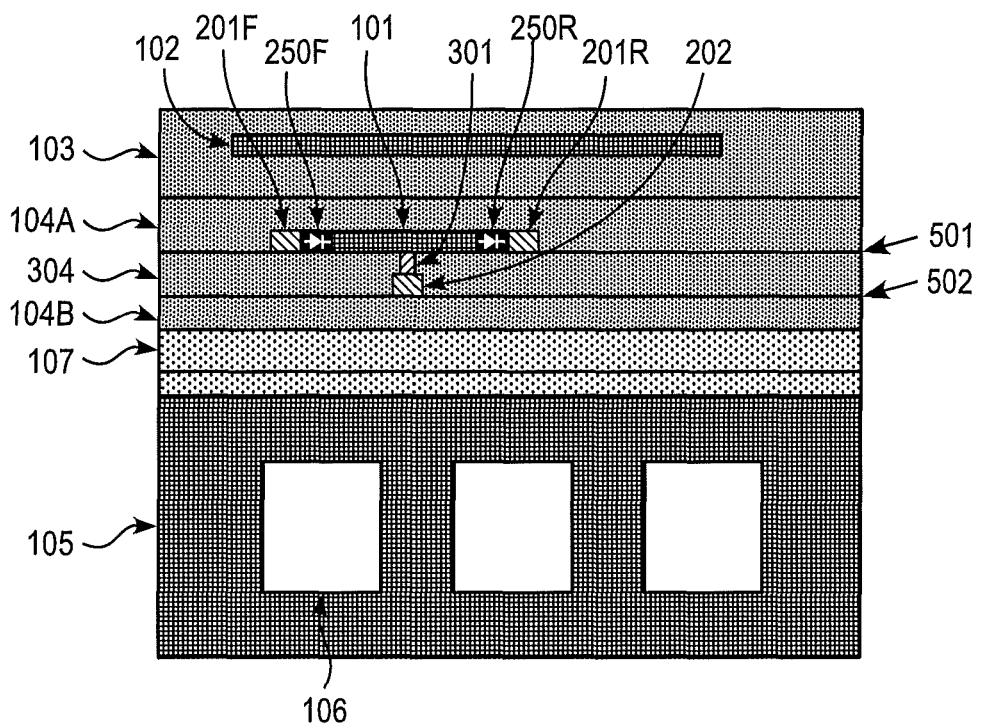

FIG. 4 shows a substrate support assembly comprising the heating plate according to an embodiment wherein the planar heater zones 101 (only one shown) are arranged in a first plane 501; the common transmission lines 202 (only one shown) are arranged in a second plane 502; and the forward branch transmission lines 201F (only one shown) and reverse branch transmission lines 201R (only one shown) are arranged in the first plane 501. The first plane 501 and second plane 502 are separated from each other by an electrically insulating layer 304. The forward branch transmission line 201F is connected to the planar heater zone 101 through a diode 250F disposed in the first plane 501. The reverse branch transmission line 201R is connected to the planar heater zone 101 through a diode 250R disposed in the first plane 501. The common transmission line 202 is connected to the planar heater zone 101 through a via 301. The diode 250F does not allow current flow from the planar heater zone 101 to the forward branch transmission line 201F. The diode 250R does not allow current flow from the reverse branch transmission line 201R to the planar heater zone 101.

Figure 5:
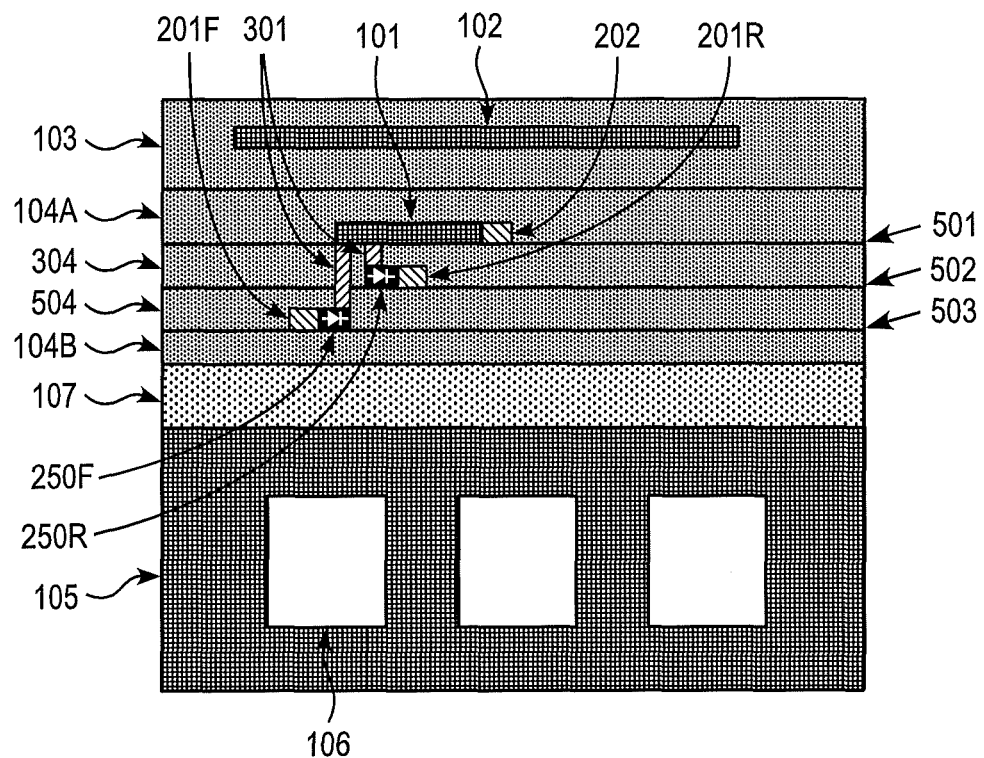

FIG. 5 shows a substrate support assembly comprising the heating plate according to an embodiment wherein the planar heater zones 101 (only one shown) are arranged in a first plane 501; the common transmission lines 202 (only one shown) are arranged in the first plane 501; the forward branch transmission lines 201F (only one shown) are arranged in a third plane 503; and reverse branch transmission lines 201R (only one shown) are arranged in a second plane 502. The first plane 501, second plane 502 and third plane 503 are separated from each other by electrically insulating layers 504 and 304. The forward branch transmission line 201F is connected to the planar heater zone 101 through a diode 250F disposed in the third plane 503 and a via 301. The reverse branch transmission line 201R is connected to the planar heater zone 101 through a diode 250R disposed in the second plane 502 and a via 301. The common transmission line 202 is connected to the planar heater zone 101. The diode 250F does not allow current flow from the planar heater zone 101 to the forward branch transmission line 201F. The diode 250R does not allow current flow from the reverse branch transmission line 201R to the planar heater zone 101.

Figure 6:
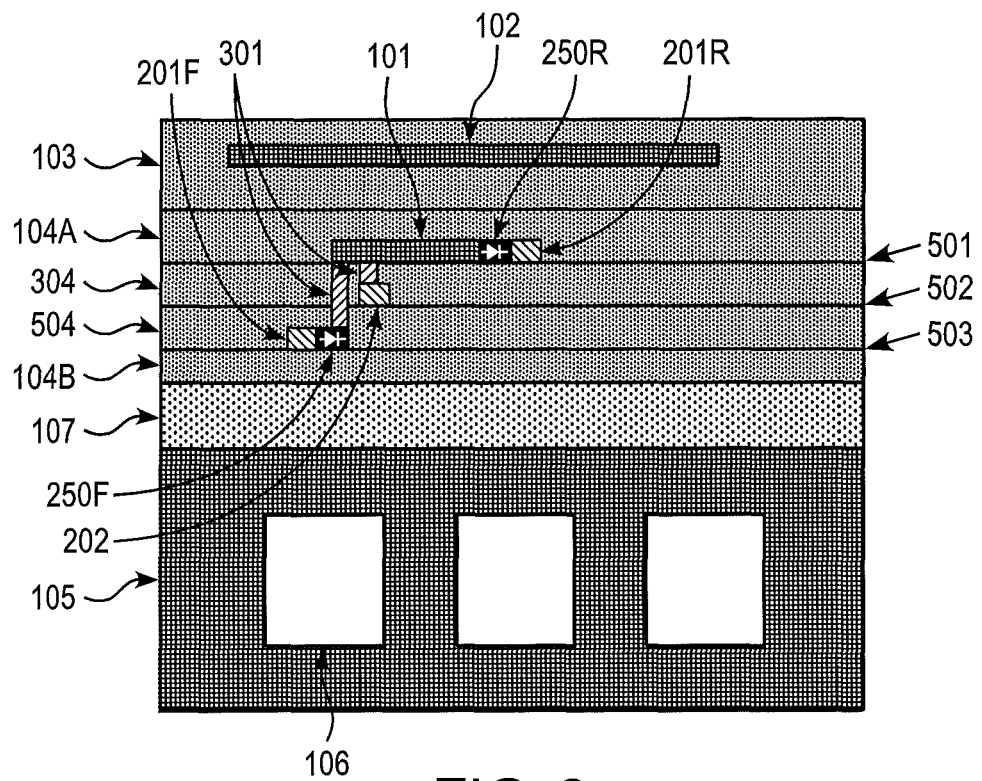

FIG. 6 shows a substrate support assembly comprising the heating plate according to an embodiment wherein the planar heater zones 101 (only one shown) are arranged in a first plane 501; the common transmission lines 202 (only one shown) are arranged in a second plane 502; the forward branch transmission lines 201F (only one shown) are arranged in a third plane 503; and reverse branch transmission lines 201R (only one shown) are arranged in the first plane 501. The first plane 501, second plane 502 and third plane 503 are separated from each other by electrically insulating layers 504 and 304. The forward branch transmission line 201F is connected to the planar heater zone 101 through a diode 250F disposed in the third plane 503 and a via 301. The reverse branch transmission line 201R is connected to the planar heater zone 101 through a diode 250R disposed in the first plane 501. The common transmission line 202 is connected to the planar heater zone 101 through a via 301. The diode 250F does not allow current flow from the planar heater zone 101 to the forward branch transmission line 201F. The diode 250R does not allow current flow from the reverse branch transmission line 201R to the planar heater zone 101.

Figure 7:
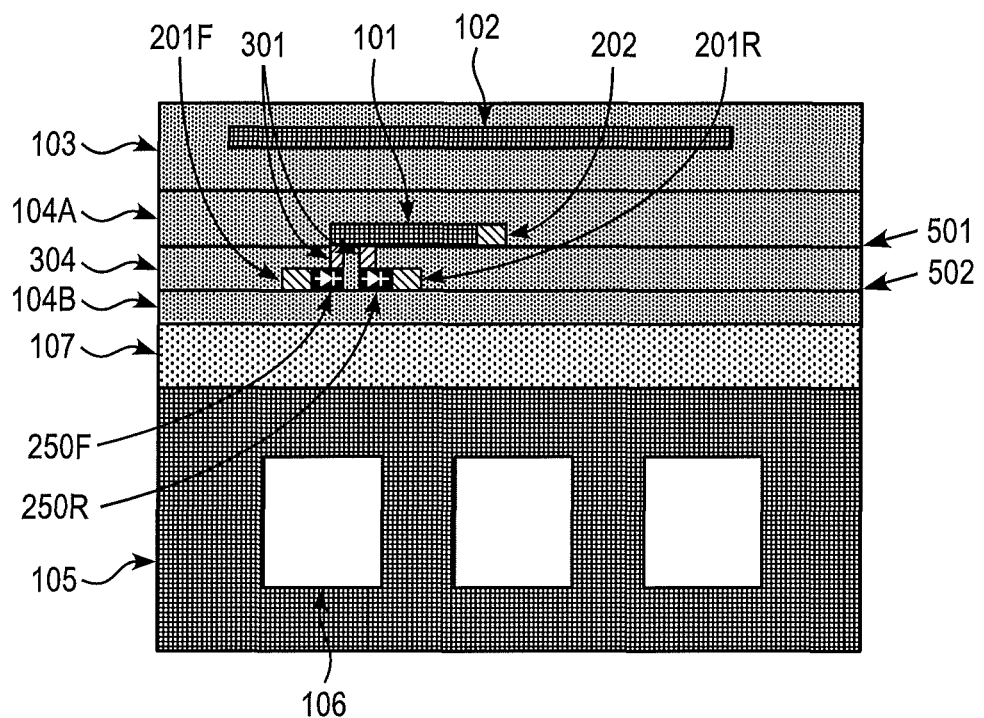

FIG. 7 shows a substrate support assembly comprising the heating plate according to an embodiment wherein the planar heater zones 101 (only one shown) are arranged in a first plane 501; the common transmission lines 202 (only one shown) are arranged in the first plane 501; the forward branch transmission lines 201F (only one shown) and reverse branch transmission lines 201R (only one shown) are arranged in a second plane 502. The first plane 501 and second plane 502 are separated from each other by an electrically insulating layer 304. The forward branch transmission line 201F is connected to the planar heater zone 101 through a diode 250F disposed in the second plane 502 and a via 301. The reverse branch transmission line 201R is connected to the planar heater zone 101 through a diode 250R disposed in the second plane 502 and a via 301. The diode 250F does not allow current flow from the planar heater zone 101 to the forward branch transmission line 201F. The diode 250R does not allow current flow from the reverse branch transmission line 201R to the planar heater zone 101.

Figure 8:
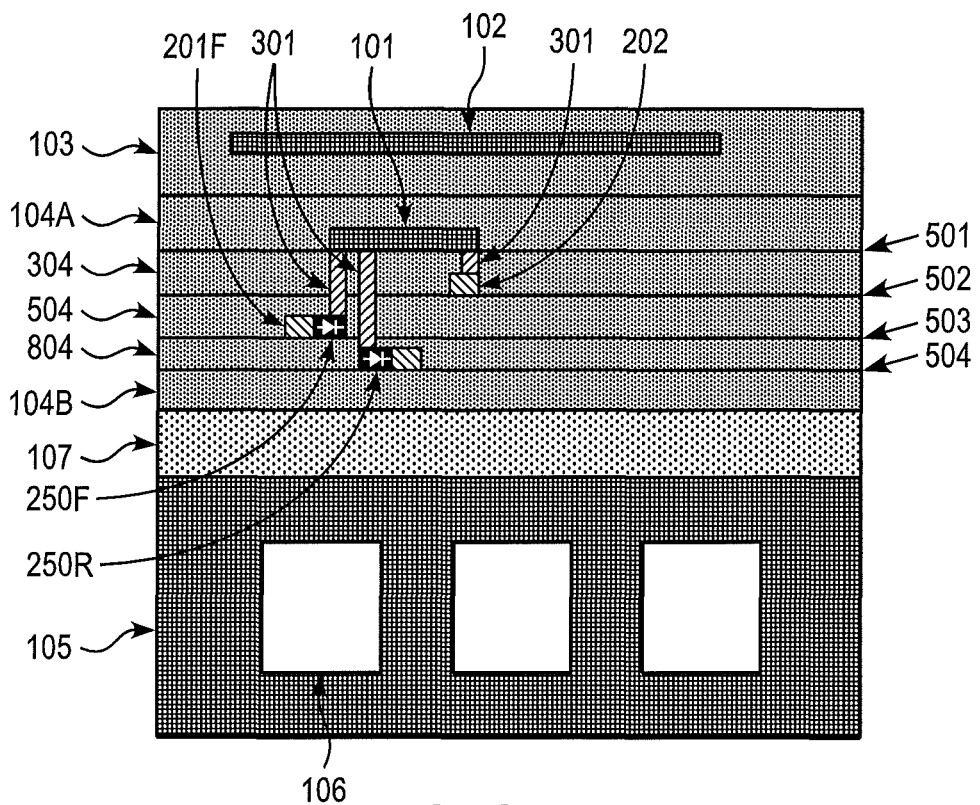

FIG. 8 shows a substrate support assembly comprising the heating plate according to an embodiment wherein the planar heater zones 101 (only one shown) are arranged in a first plane 501; the common transmission lines 202 (only one shown) are arranged in a second plane 502; the forward branch transmission lines 201F (only one shown) are arranged in a third plane 503; and reverse branch transmission lines 201R (only one shown) are arranged in a fourth plane 504. The first plane 501, second plane 502, third plane 503 and fourth plane 504 are separated from each other by electrically insulating layers 504, 304 and 804. The forward branch transmission line 201F is connected to the planar heater zone 101 through a diode 250F disposed in the third plane 503 and a via 301. The reverse branch transmission line 201R is connected to the planar heater zone 101 through a diode 250R disposed in the fourth plane 504 and a via 301. The common transmission line 202 is connected to the planar heater zone 101 through a via 301. The diode 250F does not allow current flow from the planar heater zone 101 to the forward branch transmission line 201F. The diode 250R does not allow current flow from the reverse branch transmission line 201R to the planar heater zone 101.

Figure 9:
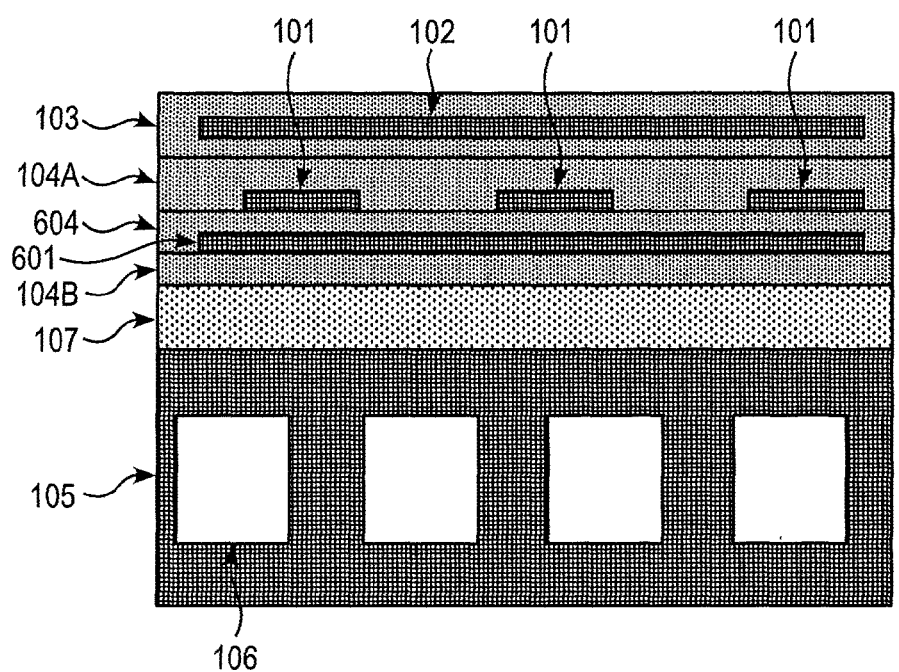
FIG. 9 shows optional primary heaters in the heating plate.

As shown in FIG. 9, with the forward branch transmission lines 201F, reverse branch transmission lines 201R, common transmission lines 202, diodes 250 and vias 301 omitted for brevity, the substrate support assembly can comprise an additional electrically insulating layer 604 in which one or more additional heaters (hereafter referred to as primary heaters 601) are incorporated. Preferably, the primary heaters 601 are individually controlled high-power heaters. The total power of the primary heaters is between 100 and 10,000 W, preferably, between 1000 and 5000 W. The primary heaters may be arranged in any desired pattern such as a rectangular grid, concentric annular zones, radial zone or combination of annular zones and radial zones. The primary heaters may be used for changing the mean temperature, coarse spatial tuning of the temperature profile, e.g., concentric heaters providing radial temperature control, or step-by-step temperature control on the substrate. The primary heaters may be located above or below the planar heater zones of the heating plate.

In one embodiment, at least one of the insulating layers in the heating plate is a sheet of polymer material. In another embodiment, at least one of the insulating layers in the heating plate is a sheet of inorganic material such as ceramic or silicon oxide. The insulating layers can also be a combination of a polymer material and a ceramic material. Examples of suitable insulating and conductive material for use in manufacture of ceramic chucks are disclosed in commonly assigned U.S. Pat. No. 6,483,690, the disclosure of which is hereby incorporated by reference.

A substrate support assembly can comprise an embodiment of the heating plate, wherein each planar heater zone of the heating plate is of similar size to or smaller than a single device die or group of device dies on the substrate so that the substrate temperature, and consequently the plasma etching process, can be controlled for each device die position to maximize the yield of devices from the substrate. The scalable architecture of the heating plate can readily accommodate the number of planar heater zones required for die-by-die substrate temperature control (typically more than 100 dies on a substrate of 300-mm diameter) with minimal number of branch transmission lines, common transmission lines, and feedthroughs in the cooling plate, thus reduces disturbance to the substrate temperature, the cost of manufacturing and complexity of adding connections to the power lines of the substrate support assembly. Although not shown, the substrate support assembly can comprise features such as lift pins for lifting the substrate, helium back cooling, temperature sensors for providing temperature feedback signals, voltage and current sensors for providing heating power feedback signals, power feed for heaters and/or clamp electrode, and/or RF filters.

In one embodiment of the method for manufacturing the heating plate, where the insulating layers are ceramic, the insulating layers may be formed by depositing the ceramic on a suitable substrate using techniques such as plasma spraying, chemical vapor deposition or sputtering. This layer can be an initial starting layer or one of the insulating layers of the heating plate.

In one embodiment of the method for manufacturing the heating plate, where the insulating layers are ceramic, the insulating layers may be formed by pressing a mixture of ceramic powder, binder and liquid into sheets and drying the sheets (hereafter referred as green sheets). The green sheets can be any desired thickness such as about 0.3 mm in thickness. The vias may be formed in the green sheets by punching holes in the green sheets. The holes are filled with a slurry of conducting powder. The heater elements, branch transmission and common transmission lines may be formed by: screen printing a slurry of conducting powder (e.g. W, WC, doped SiC or $MoSi_2$), pressing a precut metal foil, spraying a slurry of conducting powder, or any other suitable technique. Recesses for accommodating the diodes may be pressed during the forming process of the green sheets or cut in the green sheets after the forming process. The diodes may be mounted into these recesses. Multiple green sheets with a variety of components (transmission lines, vias, diodes and heater elements) are then aligned, pressed and sintered to form an entire heating plate.

In another embodiment of the method for manufacturing the heating plate, where the insulating layers are ceramic, the insulating layers may be formed by pressing a mixture of ceramic powder, binder and liquid into green sheets and drying the green sheets. The green sheets can be about 0.3 mm in thickness. Holes are punched in the green sheets for accommodating vias. Recesses for accommodating the diodes may be pressed during the forming process of the green sheets or cut in the green sheets after the forming process. Then, individual green sheets are sintered. The holes in the sintered sheets for accommodating vias are filled with a slurry of conducting power. The heater elements, branch transmission and common transmission lines may be screen printed with a slurry of conducting powder (e.g. W, WC, doped SiC or $MoSi_2$), or be formed using any other suitable technique, on the sintered sheets. Multiple sintered sheets with a variety of components (transmission lines, vias, diodes and heater elements) are then aligned and bonded with an adhesive to form an entire heating plate.

In one embodiment where the insulating layers are silicon oxide sheets, the insulating layers may be formed by depositing a thin film silicon oxide onto a suitable substrate using techniques such as evaporation, sputtering, PVD, CVD, PECVD.

In one preferred embodiment of the method for manufacturing the heating plate, a thin metal sheet (component layer) such as Al, Inconel® or Cu foil, is bonded (e.g. heat pressed, adhered with adhesive) to a first polymer film such as polyimide. A patterned resist film is applied to the surface of the component layer wherein the patterns define the shapes and positions of the electrical components such as heater elements, branch transmission lines or common transmission lines. The exposed metal is chemically etched and the resist pattern is retained in the remaining metal sheet. The resist is then removed by dissolution in a suitable solvent or dry stripping. A second polymer film with holes for accommodating vias (via layer) is aligned and bonded to the first polymer film. The sidewalls of the holes may be coated by plating metal therein. Any suitable number of component layers and via layers may be incorporated serially. Finally, exposed metal components are covered by a continuous polymer film for electrical insulation.

In another embodiment, the heater elements, branch transmission and common transmission lines are made of metal films deposited (e.g. plasma sprayed, electroplated, chemical vapor deposition, or sputtered) on an insulating layer or substrate (e.g. a green sheet).

In another embodiment, the heater elements, branch transmission and common transmission lines are made of a thin layer of amorphous conductive inorganic film such as indium tin oxide deposited (e.g. electroplated, chemical vapor deposition, or sputtered) on an insulating layer or substrate (e.g. a green sheet).

In yet another embodiment, the heater elements, forward branch transmission, reverse branch transmission and common transmission lines are made of a thin layer of conductive ceramic film deposited (e.g. chemical vapor deposition, or sputtered) on an insulating layer or substrate (e.g. a green sheet).

In one embodiment, the forward branch transmission, reverse branch transmission and common transmission lines in the heating plate may be connected to the external circuitry by terminal connectors such as spring tipped passthroughs embedded in but electrically insulated from the cooling plate.

In another embodiment, the forward branch transmission, reverse branch transmission and common transmission lines in the heating plate may be connected to the external circuitry by attaching (soldered, bonded with conductive adhesive or spot welded) lead wires to the branch transmission and common transmission lines and threading these lead wires through holes or conduits in the cooling plate.

Figure 10:
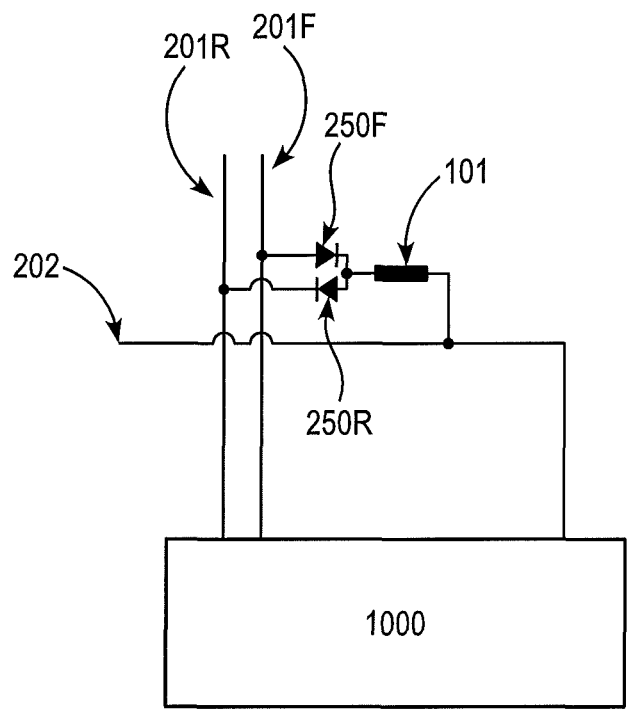
FIG. 10 shows electrical connections of one of the planar heater zones to a forward branch transmission line, a reverse branch transmission line, a common transmission line, and diodes.

FIG. 10 shows electrical connections of one of the planar heater zones 101 to a forward branch transmission line 201F, a reverse branch transmission line 201R, a common transmission line 202, and diodes 250F and 250R. A controller 1000 controls current flow through these electrical components. A controller 1000 may include elements such as a DC power supply, an AC power supply, and logic (hardware or software) to control at least one power supply. The controller 1000 may include logic to route various power supplies to different transmission lines, switch power supplies on and off, set amounts of power based on voltage or current, and set AC frequencies, among other techniques.

Figure 11:
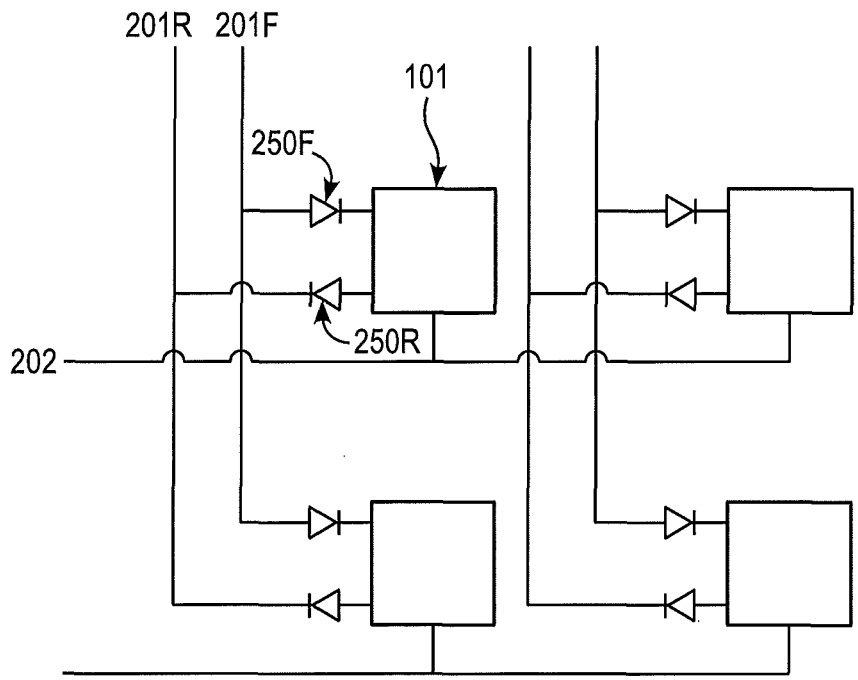
FIG. 11 shows a schematic of a substrate support assembly that illustrates connection between forward branch transmission lines, reverse branch transmission lines, common transmission lines, and diodes to an array of planar heater zones.

FIG. 11 shows a schematic of a substrate support assembly comprising one embodiment of the heating plate having an array of planar heater zones 101. Each planar heater zone 101 is connected to a forward branch transmission line 201F, a reverse branch transmission line 201R corresponding to the forward supply line 201F and a common transmission line 202. A diode 250F is serially connected between each planar heater zone 101 and the forward branch transmission line 201F connected thereto (as shown in FIG. 11) such that the diode 250F does not allow current flow from the planar heater zone 101 to the forward branch transmission line 201F. A diode 250R is serially connected between each planar heating zone 101 and the reverse branch transmission line 201R connected thereto such that diode 250R does not allow current flow from the reverse branch transmission line 201R to the planar heater zone 101. The diodes 250F and 250R can be physically located in the heating plate or any suitable location.

In a DC power scheme, the controller 1000 can selectively connect the heater zone 101 to a pair of branch transmission lines and common transmission line, e.g., electrically isolate or power the forward branch transmission line 201F, electrically isolate or connect to electrical common the reverse branch transmission line 201R and connect to electrical common or power the common transmission line 202.

The controller 1000 can drive the planar heater zone 101 with AC current in the following exemplary schemes. Driving the planar heater zone 101 with AC current has an advantage of minimizing DC electromagnetic field effects above the substrate support assembly, which can adversely affect plasma uniformity. The frequency of the AC current is preferably at least 10 Hz, more preferably at least 100 Hz, most preferably at least 1000 Hz or higher but not so high as to directly cause RF effects on the plasma.

In the first exemplary scheme, a single DC power supply that outputs a constant positive voltage is used. When the planar heater zone 101 is turned on, the controller 1000 supplies a square-wave AC current to the planar heater zones 101 by rapidly cycling between State 1 and State 2 as shown in Table 1.

TABLE 1

|  | State 1 | State 2 |
| --- | --- | --- |
| 201F | connected to the DC power supply | electrically isolated |
| 201R | electrically isolated | connected to the electrical common |
| 202 | connected to the electrical common | connected to the DC power supply |

In the second exemplary scheme, an AC power supply that outputs alternating positive and negative voltages is used. When the planar heater zone 101 is turned on, the controller 1000 connects both the forward branch transmission line 201F and the reverse branch transmission line 201R to the AC power supply and connects the electrical common to the common transmission line 202. Preferably, output from the AC power supply does not have a DC component, i.e. time average of current output from the AC power supply essentially equals zero.

Alternatively, the single DC power supply can be replaced with a dual output DC supply, a bipolar DC supply with a single switch, or other suitable arrangement.

Preferably, the forward branch transmission line 201F and its corresponding reverse branch transmission line 201R are physically routed close to each other. Namely, an area enclosed by electrical current flowing from the forward branch transmission line 201F through the planar heater zone 101 and the common transmission line 202 essentially overlaps an area enclosed by electrical current flowing from the common transmission line 202 through the planar heater zone 101 and the reverse branch transmission line 201R. For example, if the forward branch transmission line 201F and its corresponding reverse branch transmission line 201R are disposed on different planes, they can be routed such that one essentially overlies the other.

Depending on the process performed, the heater plate can have a number of heater zones suitable to achieve desired process requirements. For example, the heater plate can have at least 10, at least 100 and up to 1000 heater zones, e.g., 100-1000 heater zones. For example, the heater array may comprise at least 16, 25, 36, 49, 64, 81, 100, 121, 144, 149, 196, 225, 256, 289, 324 heater zones, or more.

Heater configurations of the above sizes may require approximately 1 KW, or more, to be distributed across the ESC. This in turn means that there are individual conductive current carrying traces and combined high current carrying busses located within the ESC ceramic to transport power to the desired point of use. Associated switching/control circuits control how and where the currents are distributed, and this may be accomplished using either analog or digital control or a mixture of both. Advantages of digital switching include that it is simpler and more efficient, although control is then effected by time division multiplexing and Pulse Width Modulation (PWM) techniques. These currents being switched on and off and run on various routings under the surface of the ESC and hence under the wafer may produce a significant electromagnetic field, which in turn may produce an (undesirable) modification to the plasma during processing and consequently to the plasma processing of the wafer. The currents involved, up to 3 A per heater zone, or more, particularly on the collective busses, up to 35 A per group, or more, could produce fields in the plasma region above the wafer up to and exceeding 1 Gauss. Fields of this magnitude applied globally in the chamber volume above the wafer may result in CD changes on the wafer of order 1 nm, which may not be acceptable to meet customer specifications.

It may be advantageous therefore, to reduce the electromagnetic fields emanating from the ESC. Different techniques have different advantages and disadvantages, and may be used individually or in combination. One concept is to create magnetic fields that interfere destructively. In simple terms, by placing an electromagnetic field near an opposing electromagnetic field, the two will cancel each other out, such that the net magnetic field above the ESC is reduced. Another concept is to lay out the ESC such that smaller maximum currents are carried and/or to minimize inductance, thus limiting the generated electromagnetic field.

The power lines can be spatially arranged in such a way as to create opposing electromagnetic fields that will cancel each other out and reduce the net magnetic field above the ESC, which will in turn reduce plasma non-uniformity. For example, the power lines can be placed next to each other in a horizontal plane. Alternatively, power lines can be placed one on top of the other in a vertical plane. Diagonal configurations of power lines could also be used. Additionally, arranging power lines to be substantially parallel to one another can minimize net magnetic fields above the ESC.

Another concept is to change the properties of the power lines themselves. Power lines that are wide yet short result in a different magnetic field than power lines that are thinner but taller. Additionally, the use of a coaxial arrangement could be more beneficial in reducing plasma non-uniformity.

An ideal spatial arrangement may use any combination of the above techniques. For example, when power lines are wide and short, arranging them in a vertical plane may be the most effective way of reducing net electromagnetic field. However, when power lines are taller and not as thick, a horizontal or diagonal arrangement may be more beneficial. Techniques such as causing current to flow in opposite directions on two such spatially arranged power lines can result in reducing the net magnetic field. It will be apparent to persons skilled in the art that the most suitable configuration of spatial arrangement and power line properties can vary from application to application.

While a heating plate, methods of manufacturing the heating plate, a substrate support assembly comprising the heating plate, and a controller for powering the heating plate have been described in detail with reference to specific embodiments thereof, it will be apparent to those skilled in the art that various changes and modifications can be made, and equivalents employed, without departing from the scope of the appended claims. For instance, the substrate support assembly can include temperature sensors for monitoring substrate temperature, a power feed arrangement to power the ESC with desired clamping voltage, a lifting pin arrangement for raising and lowering a substrate, a heat transfer gas feed arrangement for supplying gas such as helium to the underside of the substrate, a temperature controlled liquid feed arrangement to supply heat transfer liquid to the cooling plate, a power feed arrangement to individually power primary heaters above or below the planar heater zones, a power feed arrangement to supply RF power at one or more frequencies to a lower electrode incorporated in the substrate support assembly, and the like.

We claim:
1. A heating plate for a substrate support assembly used to support a semiconductor substrate in a semiconductor processing apparatus, the heating plate comprising:
   a first electrically insulating layer; a plurality of heater zones comprising at least first, second, third and fourth heater zones, the heater zones distributed across the first electrically insulating layer and operable to tune a spatial temperature profile on the substrate;
   a plurality of diodes including at least first, second, third, fourth, fifth, sixth, seventh, and eighth diodes;
   a plurality of first power lines comprising a first electrically conductive branch transmission line electrically connected to the first heater zone via the first diode and the second heater zone via the third diode and a third electrically conductive branch transmission line electrically connected to the first heater zone via the second diode and the second heater zone via the fourth diode and a second electrically conductive branch transmission line electrically connected to the third heater zone via the fifth diode and the fourth heater zone via the seventh diode and a fourth electrically conductive branch transmission line electrically connected to the third heater zone via the sixth diode and the fourth heater zone via the eighth diode; and
   a plurality of second power lines comprising at least a first electrically conductive common transmission line electrically connected to the first heater zone and the third heater zone and a second electrically conductive common transmission line electrically connected to the second heater zone and the fourth heater zone,
   wherein the first power lines and/or second power lines are spatially arranged to minimize electromagnetic fields above the heating plate and reduce plasma non-uniformity caused by such electromagnetic fields;
   wherein each heater zone includes at least one resistance heater element.
2. The heating plate of claim 1, wherein:
   an anode of the first diode is connected to the first branch transmission line and a cathode of the first diode is connected to the first heater zone;
   an anode of the second diode is connected to the first heater zone and a cathode of the second diode is connected to the third branch transmission line;
   an anode of the third diode is connected to the first branch transmission line and a cathode of the third diode is connected to the second heater zone;
   an anode of the fourth diode is connected to the second heater zone and a cathode of the fourth diode is connected to the third branch transmission line;
   an anode of the fifth diode is connected to the second branch transmission line and a cathode of the fifth diode is connected to the third heater zone;
   an anode of the sixth diode is connected to the third heater zone and a cathode of the sixth diode is connected to the fourth branch transmission line;
   an anode of the seventh diode is connected to the second branch transmission line and a cathode of the seventh diode is connected to the fourth heater zone; and
   an anode of the eighth diode is connected to the fourth heater zone and a cathode of the eighth diode is connected to the fourth branch transmission line.
3. The heating plate of claim 2, wherein:
   (a) the heater zones are in a first plane; the common transmission lines are in a second plane parallel to the first plane; the branch transmission lines are in a third plane parallel to the first plane; the first, second and third planes are separated from one another by the first and a second electrically insulating layers; the common transmission lines are electrically connected to the heater zones by vias extending vertically in the first electrically insulating layer; the respective diodes of the branch transmission lines are electrically connected to the heater zones by vias extending vertically in thei first and second electrically insulating layers;

(b) the heater zones and the branch transmission lines are in the first plane; the common transmission lines are in the second plane parallel to the first plane; the first and second planes are separated from one another by the first electrically insulating layer; the common transmission lines are electrically connected to the heater zones by vias extending vertically in the first electrically insulating layer;

(c) the heater zones and the common transmission lines are in the first plane; the first and second branch transmission lines are in the third plane parallel to the first plane; the third and fourth branch transmission lines are in the second plane parallel to the first plane; the first and second planes are separated by the first electrically insulating layer; the second and third planes are separated by the second electrically insulating layer; the respective diodes of the first and second branch transmission lines are electrically connected to the heater zones by vias extending through the first and second electrically insulating layers; the respective diodes of the third and fourth branch transmission lines are electrically connected to the heater zones by vias extending through the first electrically insulating layer;

(d) the heater zones and the third and fourth branch transmission lines are in the first plane; the first and second branch transmission lines are in the third plane parallel to the first plane; the common transmission lines are in the second plane parallel to the first plane; the first and second planes are separated by the first electrically insulating layer; the second and third planes are separated by the second electrically insulating layer; the respective diodes of the first and second branch transmission lines are electrically connected to the heater zones by vias extending through the first and second electrically insulating layers; the common transmission lines are electrically connected to the heater zones by vias extending through the first electrically insulating layer;

(e) the heater zones and the common transmission lines are in the first plane; the branch transmission lines are in the second plane parallel to the first plane; the first and second planes are separated from one another by the first electrically insulating layer; the respective diodes of the branch transmission lines are electrically connected to the heater zones by vias extending vertically in the first electrically insulating layer; or (f) the heater zones are in the first plane; the common transmission lines are in the second plane parallel to the first plane; the first and second branch transmission lines are in the third plane parallel to the first plane; the third and fourth branch transmission lines are in a fourth plane parallel to the first plane; the first and second planes are separated by the first electrically insulating layer; the second and third planes are separated by the second electrically insulating layer; the third and fourth planes are separated by a third electrically insulating layer; the respective diodes of the first and second branch transmission lines are electrically connected to the heater zones by vias extending through the first and second electrically insulating layers; the respective diodes of the third and fourth branch transmission lines are electrically connected to the heater zones by vias extending through the first, second and third electrically insulating layers; the common transmission lines are electrically connected to the heater zones by vias extending through the first electrically insulating layer.

4. The heating plate of claim 2, wherein the heater zones are planar heater zones sized such that:
   (a) each planar heater zone is not larger than four device dies being manufactured on the semiconductor substrate, or
   (b) each planar heater zone is not larger than two device dies being manufactured on the semiconductor substrate, or
   (c) each planar heater zone is not larger than one device die being manufactured on the semiconductor substrate, or
   (d) the area of each planar heater zone is between 2 and 3 square centimeters, or
   (e) the heating plate includes 100 to 400 planar heater zones, or
   (f) each planar heater zone is 1 to 15 $cm^2$, or
   (g) each planar heater zone is 16 to 100 $cm^2$, or
   (h) each planar heater zone is scaled with sizes of device dies on the semiconductor substrate and the overall size of the semiconductor substrate.

5. The heating plate of claim 2, wherein (a) the first electrically insulating layer comprises a polymer material, a ceramic material, or a combination thereof; (b) a total area of the heater zones is from 50% to 90% or over 90% of an upper surface of the heating plate; and/or (c) the heater zones are arranged in a rectangular grid, hexagonal grid or polar array; and the heater zones are separated from each other by gaps at least 1 millimeter in width and at most 10 millimeters in width.

6. The heating plate of claim 2, wherein the heating plate is configured to rectify a power signal, such that the heating plate is capable of being driven by AC current.

7. The heating plate of claim 1, wherein current on the first power lines is committed in the opposite direction of current committed on the second power lines.

8. The heating plate of claim 7, wherein: (a) a segment of one power line is above a segment of another power line in a vertical plane; (b) a segment of one power line is parallel and adjacent to the segment of another power line; (c) each heater zone is electrically coupled to three power lines; (d) said heating plate comprises at least 10 heaters; (e) the first and second power lines are each configured to conduct at least approximately one kilowatt of power to the heater zones; or (f) at least one power line is configured to be a high current carrying bus.

9. The heating plate of claim 7, wherein: (a) the heater zones are arranged in a pattern selected from the group consisting of: a rectangular grid; a hexagonal grid; a polar array and concentric rings; (b) each heater zone is separately addressable by a power source; (c) a power line which is electrically connected to a heater zone on a first half of the heating plate is not electrically coupled to any heater zones not on the first half of the heating plate; or (d) the heater zones are coupled to more power lines than twice the square root of the number of heater zones.

10. A substrate support assembly comprising:
   an electrostatic chuck (ESC) including an electrostatic clamping layer having at least one clamping electrode configured to electrostatically clamp a semiconductor substrate on the substrate support assembly;
   the heating plate of claim 2 arranged below the electrostatic clamping layer; and a cooling plate attached to a lower side of the heating plate by a thermal barrier layer.

11. The substrate support assembly of claim 10, wherein:
(a) the branch transmission lines are connected to leads electrically insulated from each other and extended through at least one branch transmission conduit in the cooling plate and the common transmission lines are connected to leads electrically insulated from each other and extended through at least one common transmission conduit in the cooling plate; or
(b) the branch transmission lines and common transmission lines are connected to terminal connectors embedded in the cooling plate.

12. The substrate support assembly of claim 10, further comprising a controller operable to selectively supply AC current to one or more of the heater zones.

13. The substrate support assembly of claim 12, wherein the controller is operable to selectively supply AC current to:
(a) only the first heater zone by connecting an AC power supply to the first and third branch transmission lines and by connecting electrical common to the first common transmission line,
(b) only the second heater zone by connecting the AC power supply to the first and third branch transmission lines and by connecting electrical common to the second common transmission line,
(c) only the third heater zone by connecting the AC power supply to the second and fourth branch transmission lines and by connecting electrical common to the first common transmission line,
(d) only the fourth heater zone by connecting the AC power supply to the second and fourth branch transmission lines and by connecting electrical common to the second common transmission line,
(e) only the first and second heater zones by connecting the AC power supply to the first and third branch transmission lines and by connecting electrical common to the first and second common transmission lines,
(f) only the first and third heater zones by connecting the AC power supply to the first, second, third and fourth branch transmission lines and by connecting electrical common to the first common transmission line,
(g) only the second and fourth heater zones by connecting the AC power supply to the first, second, third and fourth branch transmission lines and by connecting electrical common to the second common transmission line,
(h) only the third and fourth heater zones by connecting the AC power supply to the second and fourth branch transmission lines and by connecting electrical common to the first and second common transmission lines, and
(i) all of the heater zones by connecting the AC power supply to the first, second, third and fourth branch transmission lines and by connecting electrical common to the first and second common transmission lines.

14. The substrate support assembly of claim 13, wherein AC current from the AC power supply does not have a DC component.

15. The substrate support assembly of claim 12, wherein the controller is operable to selectively supply AC current to:
(a) only the first heater zone by cycling between a state wherein the first branch transmission line is connected to a DC power supply, the third branch transmission line is electrically isolated and the first common transmission line is connected to electrical common and a state wherein the first branch transmission line is electrically isolated, the third branch transmission line is connected to electrical common and the first common transmission line is connected to the DC power supply,
(b) only the second heater zone by cycling between a state wherein the first branch transmission line is connected to the DC power supply, the third branch transmission line is electrically isolated and the second common transmission line is connected to electrical common and a state wherein the first branch transmission line is electrically isolated, the third branch transmission line is connected to electrical common and the second common transmission line is connected to the DC power supply,
(c) only the third heater zone by cycling between a state wherein the second branch transmission line is connected to the DC power supply, the fourth branch transmission line is electrically isolated and the first common transmission line is connected to electrical common and a state wherein the second branch transmission line is electrically isolated, the fourth branch transmission line is connected to electrical common and the first common transmission line is connected to the DC power supply,
(d) only the fourth heater zone by cycling between a state wherein the second branch transmission line is connected to the DC power supply, the fourth branch transmission line is electrically isolated and the second common transmission line is connected to electrical common and a state wherein the second branch transmission line is electrically isolated, the fourth branch transmission line is connected to electrical common and the second common transmission line is connected to the DC power supply,
(e) only the first and second heater zones by cycling between a state wherein the first branch transmission line is connected to the DC power supply, the third branch transmission line is electrically isolated and the first and second common transmission lines are connected to electrical common and a state wherein the first branch transmission line is electrically isolated, the third branch transmission line is connected to electrical common and the first and second common transmission lines are connected to the DC power supply,
(f) only the first and third heater zones by cycling between a state wherein the first and second branch transmission lines are connected to the DC power supply, the third and fourth branch transmission lines are electrically isolated and the first common transmission line is connected to electrical common and a state wherein the first and second branch transmission lines are electrically isolated, the third and fourth branch transmission lines are connected to electrical common and the first common transmission line is connected to the DC power supply,
(g) only the second and fourth heater zones by cycling between a state wherein the first and second branch transmission lines are connected to the DC power supply, the third and fourth branch transmission lines are electrically isolated and the second common transmission line is connected to electrical common and a state wherein the first and second branch transmission lines are electrically isolated, the third and fourth branch transmission lines are connected to electrical common and the second common transmission line is connected to the DC power supply,
(h) only the third and fourth heater zones by cycling between a state wherein the second branch transmission line is connected to the DC power supply, the fourth branch transmission line is electrically isolated and the first and second common transmission lines are connected to electrical common and a state wherein the second branch transmission line is electrically isolated, the fourth branch transmission line is connected to electrical common and the first and second common transmission lines are connected to the DC power supply, and (i) all of the heater zones by cycling between a state wherein the first and second branch transmission lines are connected to the DC power supply, the third and fourth branch transmission lines are electrically isolated and the first and second common transmission lines are connected to electrical common and a state wherein the first and second branch transmission lines are electrically isolated, the third and fourth branch transmission lines are connected to electrical common and the first and second common transmission lines are connected to the DC power supply;

wherein the DC power supply outputs a constant voltage.

16. The substrate support assembly of claim 12, wherein the AC current has a frequency of at least 10 Hz.

17. The substrate support assembly of claim 10, further comprising at least one primary heater layer arranged above or below the first electrically insulating layer of the heating plate, wherein the primary heater layer is electrically insulated from the heater zones, the branch transmission lines, and the common transmission lines of the heating plate; the primary heater layer includes at least one heater which provides mean temperature control of the semiconductor substrate; the heater zones provide radial and azimuthal temperature profile control of the semiconductor substrate, during processing thereof.

18. The substrate support assembly of claim 17, wherein the primary heater layer includes two or more heaters.

19. The substrate support assembly of claim 10, further comprising a power controller capable of digital switching.

20. The substrate support assembly of claim 10, further comprising a power controller capable of producing at least one of time-division multiplexed power, pulse-width modulated power, alternating current power, or direct current phase alternating power.

* * * * *